(12) United States Patent
Freeman et al.

(10) Patent No.: US 6,506,656 B2
(45) Date of Patent: Jan. 14, 2003

(54) STEPPED COLLECTOR IMPLANT AND METHOD FOR FABRICATION

(75) Inventors: Gregory G. Freeman, Hopewell Junction, NY (US); Basanth Jagannathan, Stormville, NY (US); Shwu-Jen Jeng, Wappingers Falls, NY (US); Jeffrey B. Johnson, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/811,859

(22) Filed: Mar. 19, 2001

(65) Prior Publication Data

US 2002/0132434 A1 Sep. 19, 2002

(51) Int. Cl.[7] ................. H01L 21/331; H01L 21/8222
(52) U.S. Cl. ........................ 438/309; 438/370
(58) Field of Search ................. 438/268, 299, 438/309, 311, 322, 350, 355, 370, 338, 369, 373

(56) References Cited

U.S. PATENT DOCUMENTS

| | | | |
|---|---|---|---|
| 4,110,126 A | * 8/1978 | Bergeron et al. | 148/1.5 |
| 4,868,631 A | * 9/1989 | Hollingsworth et al. | 357/48 |
| 4,958,208 A | 9/1990 | Tanaka | 357/34 |
| 5,371,378 A | * 12/1994 | Das | 257/77 |
| 5,397,714 A | 3/1995 | DeJong et al. | 438/540 |
| 5,436,179 A | 7/1995 | Erdeljac et al. | 438/340 |
| 5,569,612 A | 10/1996 | Frisina etal. | 438/350 |
| 5,571,731 A | 11/1996 | Grutzediek et al. | 438/339 |
| 5,589,409 A | 12/1996 | Bulucea et al. | 438/377 |
| 5,668,397 A | 9/1997 | Davis et al. | 257/520 |
| 5,858,828 A | 1/1999 | Seliskar et al. | 438/234 |
| 5,885,880 A | 3/1999 | Gomi | 438/322 |
| 5,929,506 A | 7/1999 | Hutter et al. | 257/544 |
| 6,001,701 A | 12/1999 | Carroll et al. | 438/364 |

OTHER PUBLICATIONS

"High Performance Bipolar Transistor With Low C", IBM Technical Disclosure Bulletin, vol. 22, No. 12, May 1980, Das, et al., pp. 5556–5557.

* cited by examiner

Primary Examiner—David Nelms
Assistant Examiner—Phuc T. Dang
(74) Attorney, Agent, or Firm—Schmeiser, Olsen & Watts

(57) ABSTRACT

The present invention provides a unique device structure and method that provides increased transistor performance in integrated bipolar circuit devices. The preferred embodiment of the present invention provides improved high speed performance with a stepped collector dopant profile that reduces emitter-collector transit time and parasitic resistance with minimal increase in parasitic capacitances. The preferred stepped collector dopant profile includes a shallow implant and a deeper implant. The shallow implant reduces the base-collector space-charge region width, reduce resistance, and tailors the collector-base breakdown characteristics. The deeper implant links the buried collector to the subcollector and provides a low resistance path to the subcollector. The stepped collector dopant profile has minimal impact on the collector-base capacitance outside the intrinsic region of the device since the higher dopant is compensated by, or buried in, the extrinsic base dopants outside the intrinsic region.

14 Claims, 14 Drawing Sheets

“STEPPED COLLECTOR IMPLANT AND METHOD FOR FABRICATION”

BACKGROUND OF THE INVENTION

1. Technical Field

The present invention relates generally to the field of semiconductor manufacturing and, more specifically, to a method for forming improved transistors that have improved high frequency response.

2. Background Art

The need to remain cost and performance competitive in the production of semiconductor devices has caused continually increasing device density and device performance in integrated circuits. To facilitate the increase in device density, new technologies are constantly needed to allow the feature size of these semiconductor devices to be reduced while increasing the performance of the devices.

Transistor performance is of particular concern in bipolar transistor design. Bipolar transistors are commonly used for analog devices where operational speed is of paramount concern. There are many different critical features in the design of high performance bipolar transistors. These include the vertical dimension of the bipolar transistor, the collector doping, collector-base and base-emitter capacitances, and collector and base resistances. To achieve higher performance, it is generally desirable to reduce the vertical dimension of the transistor. This reduces the transit time and thus can increase performance. Also, it is generally desirable to increase the collector doping concentration. This reduces collector resistance and thus can also increase performance. These goals are generally compatible, as a vertical dimension reduction is achieved partly by the increase in collector doping concentration since the collector-base space-charge region shrinks with higher doping concentrations.

Unfortunately, simply reducing transistor vertical dimension and increasing the collector doping concentration has the negative result of increasing collector-base capacitance. The increase in collector-base capacitance has a negative impact on the performance of the device, and thus can negate the benefits of reducing the vertical dimension and increasing collector doping concentration.

Thus, what is needed is an improved device structure and method that improves transistor performance with minimal increase of unwanted capacitance in the device. Without an improved method and structure for forming such devices the performance of these devices will continue to be compromised.

DISCLOSURE OF INVENTION

Accordingly, the present invention provides a unique device structure and method that provides increased transistor performance in integrated bipolar circuit devices. The preferred embodiment of the present invention provides improved high speed performance with a stepped collector dopant profile that reduces emitter-collector transit time and parasitic resistance with minimal increase in parasitic capacitances. The preferred stepped collector dopant profile includes a shallow implant and a deeper implant. The shallow implant reduces the base-collector space-charge region width, reduces resistance, and tailors the collector-base characteristics. The deeper implant links the buried collector to the subcollector and provides a low resistance path to the subcollector. The stepped collector dopant profile has minimal impact on the collector-base capacitance outside the intrinsic region of the device since the higher dopant is compensated by, or buried in, the extrinsic base dopants outside the intrinsic region.

The foregoing and other advantages and features of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements.

BEST MODE FOR CARRYING OUT THE INVENTION

The present invention provides a unique device structure and method that provides increased transistor performance in integrated bipolar circuit devices. The preferred embodiment of the present invention provides improved high speed performance with a stepped collector dopant profile that reduces emitter-collector transit time and parasitic resistance with minimal increase in parasitic capacitances. The preferred stepped collector dopant profile includes a shallow implant and a deeper implant. The shallow implant reduces the base-collector space-charge region width, reduce resistance, and tailors the collector-base breakdown characteristics. The deeper implant links the buried collector to the subcollector and provides a low resistance path to the subcollector. The stepped collector dopant profile has minimal impact on the collector-base capacitance outside the intrinsic region of the device since the higher dopant is compensated by, or buried in, the extrinsic base dopants outside the intrinsic region.

Figure 1:
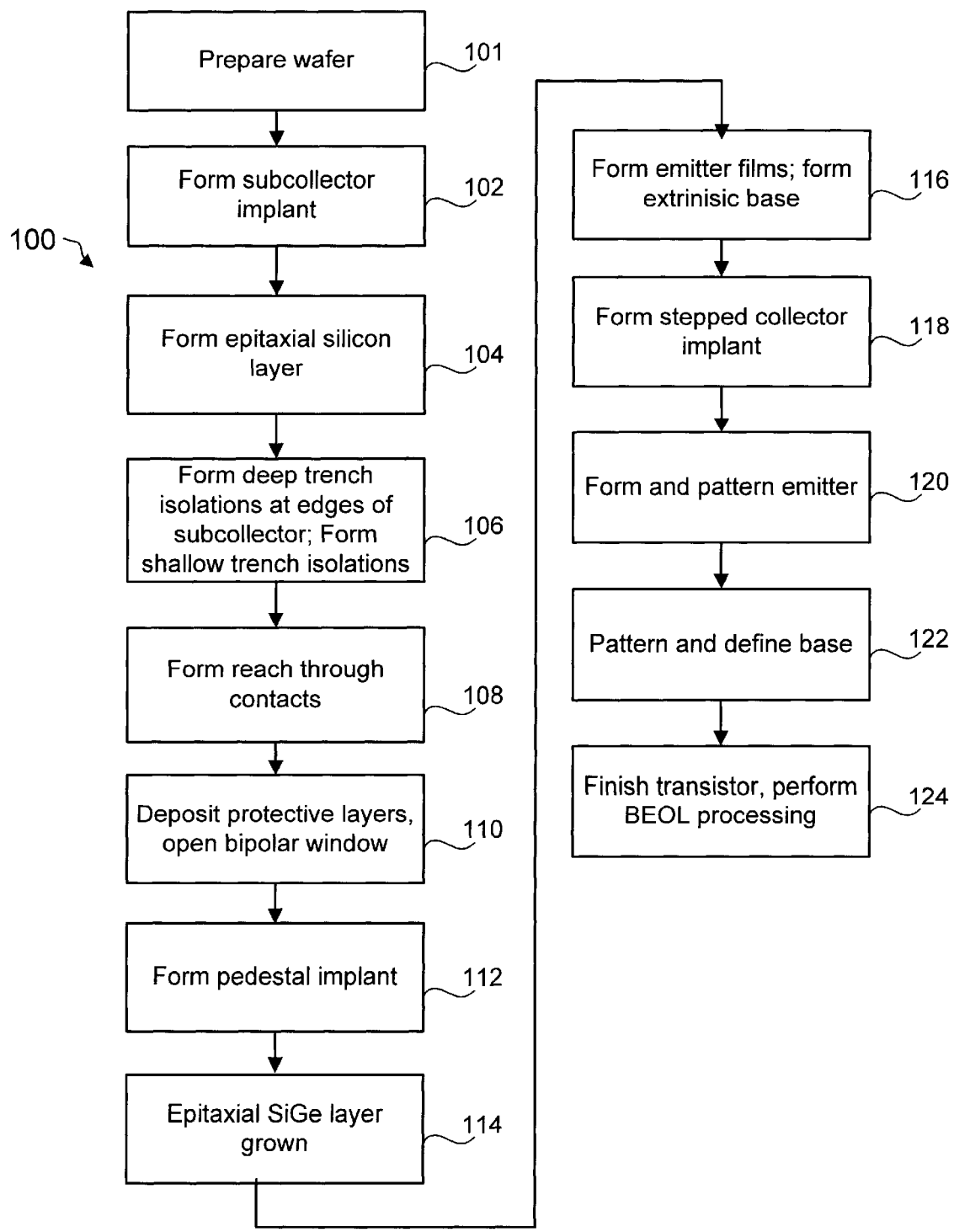
FIG. 1 is a flow diagram illustrating a preferred method in accordance with the present invention.

Turning now to FIG. 1, a method 100 for forming an integrated circuit in accordance is illustrated. In the preferred embodiment, the fabrication process is one that provides the ability to fabricate bipolar transistors. For example, a BiCMOS process that can form bipolar transistors can be used. Such a process can be used to provide both the high performance available from bipolar transistors and the high density logic available from FET devices.

As will be explained in greater detail later, in the most preferred embodiment silicon germanium (SiGe) heterojunction bipolar transistors (HBTs) are formed to provide high speed analog processing. Of course, other bipolar transistor technology can be used, including bipolar junction transistors. Thus, the result is a solution that utilizes SiGe BiCMOS to provide high speed analog and/or digital devices. The preferred process can be used to form devices used in a wide range of applications, including high speed wireless communication.

It should also be noted that while the preferred embodiment method 100 will be described with reference to the fabrication and use with a bipolar NPN transistor, that the structure can be used with other devices, most obviously a PNP transistor and other BiCMOS passive and active elements. For example, it can be used in conjunction with a varactor, a p-i-n diode, resistors, and/or an isolated FET.

Furthermore, it can be used with various different kinds of transistor designs, such as homojunction bipolar transistors, SiGe heterojunction transistors, and/or SiGeC transistors. In those cases, the method will vary from method 100 in ways appropriate to the device formed.

The first step of method 101 is to prepare the wafer. This suitably involves providing a p type, single crystal silicon wafer, followed by processing to remove surface defects. In the preferred embodiment, the wafer comprises a lightly doped, high resistivity, p-substrate. Such a substrate provides for low noise transmission, improved on-chip inductors, and low collector substrate capacitance, and thus improves the noise tolerance and performance of the resulting bipolar transistors and total chip solution.

The next step 102 is to form a subcollector implant in the wafer. This preferably comprises forming a highly n+ doped implant at the surface of the wafer in areas where bipolar devices are to be formed. In particular, the preferred process is as follows: A subcollector (NZ) mask is placed on the surface of the wafer. The mask is then selectively removed to open a central region for the subcollector implant. A high dose implant is done, preferably a n+ dopant, to form a subcollector region.

Figure 2:
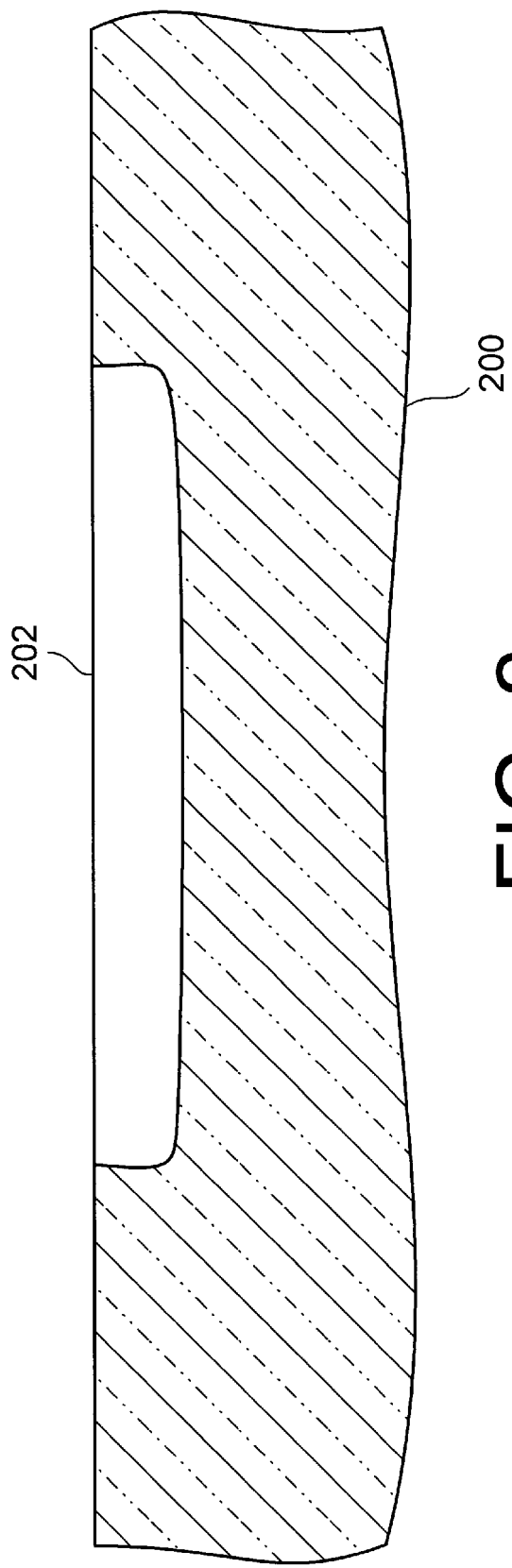
FIGS. 2–14 are schematic cross sections of a wafer substrate illustrating an embodiment of the present invention.

Turning to FIG. 2, a wafer portion 200 is illustrated after the formation of a subcollector implant 202. Again, wafer portion 200 preferably comprises a lightly doped p-wafer, and subcollector implant 202 preferably comprises a highly doped, n+ implant.

Returning to FIG. 1, the next step 104 is to grow an epitaxial layer over the surface of the wafer. Preferably the epitaxial layer as formed comprises a 1–4 micron thick lightly doped layer. Because the epitaxial process is a hot process, the subcollector implant diffuses into the epitaxial layer and further diffuses into the substrate.

Figure 3:
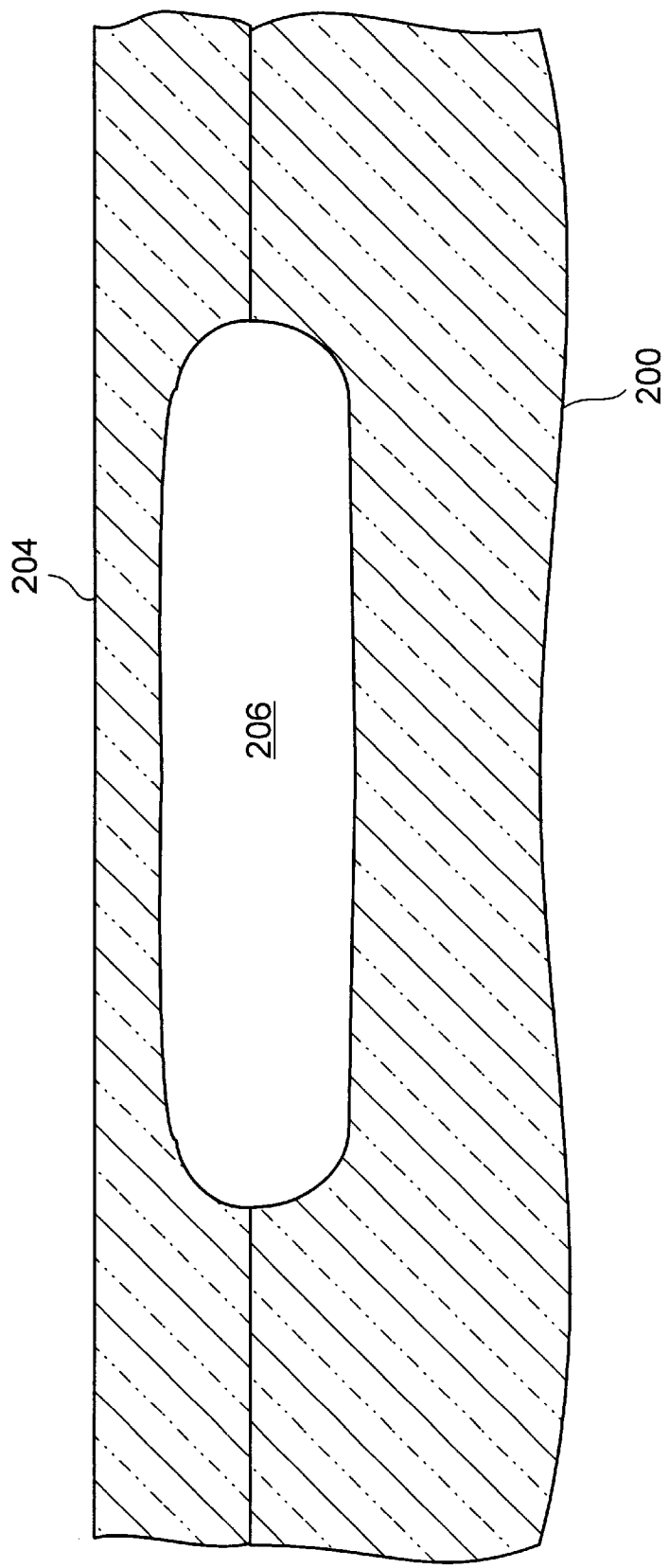

Turning now to FIG. 3, the wafer portion 200 is illustrated after the formation of an epitaxial layer 204. The process of forming the epitaxial layer 204 has likewise caused the subcollector implant 202 to diffuse, forming the subcollector 206.

Returning to FIG. 1, the next step 106 is to form a deep trench isolation around the edges of the subcollector. In the preferred embodiment, the deep trench isolations are formed deep enough to extending through the buried layer and subcollector. The preferred process for forming deep isolation trenches is as follows. First, a deep trench (DT) resist is deposited and selectively removed to form a mask for etching deep trenches in the epitaxial layer and wafer substrate. Etching is then done by reactive ion etching (RIE) or other suitable technique to form the deep trenches in the substrate. A channel stop is then implanted across the wafer, forming an implant at the bottom of the trench. An isolation film is then deposited there over to form an oxide dielectric in the trench. The remaining portions of the deep trench are then filled with polysilicon.

Figure 4:
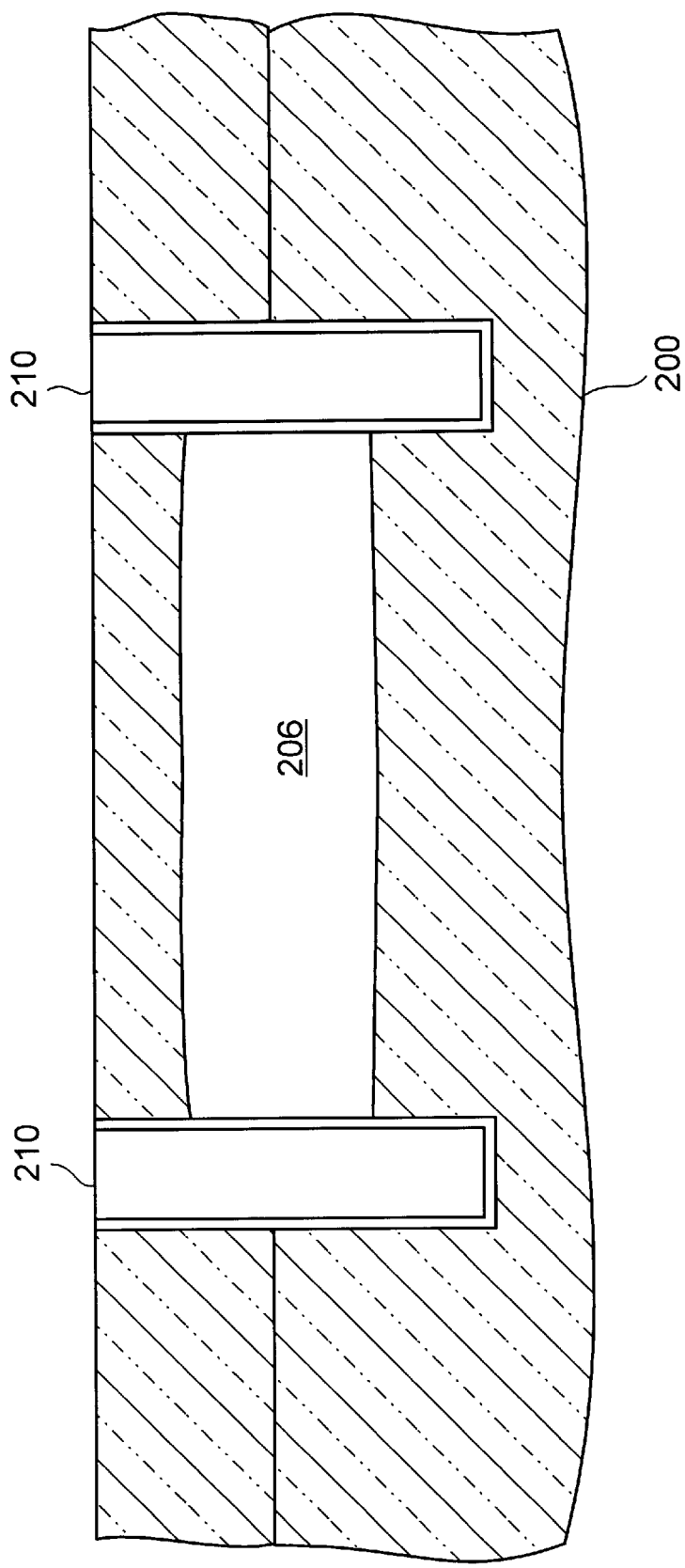

Turning now to FIG. 4, the wafer portion 200 is illustrated after the formation of deep trench isolation 210. The deep trench isolation 210 is formed at the edges of the subcollector 206 and extends through the subcollector 206. The preferred embodiment deep trench isolation 210 is lined with oxide and then filled with polysilicon. Thus formed, the deep trench isolation 210 serves to isolate the subcollector 206.

Returning to FIG. 1, the next part of step 106 is to form shallow trench isolations in non-active area regions of the wafer. Additionally, a shallow trench isolation region is preferably formed to separate the NPN area of the bipolar transistor from the reach through contact area. This is preferably done by etching shallow trenches in selective areas, filling those trenches with suitable dielectrics, and planarizing the top surface of the shallow trench isolations and the wafer.

Figure 5:
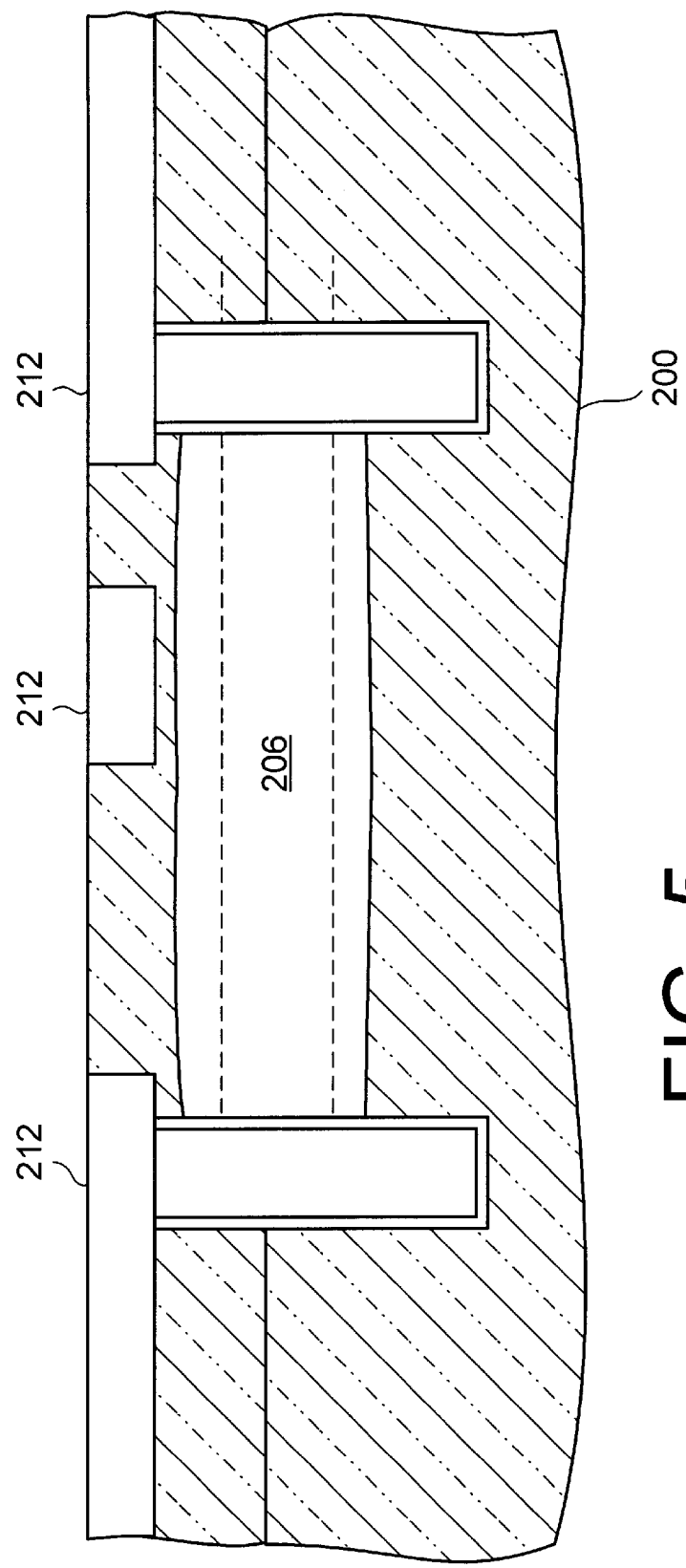

Turning now to FIG. 5, the wafer portion 200 is illustrated after the formation of shallow trench isolation regions 212. Shallow trench isolation regions 212 have been formed in the non-active areas, as well as between the NPN area of the bipolar transistor and the reach through contact area.

Returning to FIG. 1, with the shallow trench isolations formed, the next step 108 is to form reach through contacts to contact to the collector of the bipolar transistor. This is preferably done by selectively depositing a reach through implant resist (RN), leaving openings over the reach through region between the shallow trench isolation regions. A reach through implant is then performed using ion implantation across the wafer. The RN resist is then stripped.

The next step 110 is to form protective layers on the wafer and open a bipolar window in the layers. In particular, an NPN protective nitride is then deposited over the surface of the wafer, and a protect nitride resist (PX) is deposited and selectively removed, except over the NPN area and a portion of the adjacent shallow trench isolation. The protective nitride is then stripped, except where protected by the PX resist.

Next a protective oxide layer is applied followed by a polysilicon protective layer and oxide layers. A resist layer (BX) is then deposited and patterned to open the bipolar window and thus reveal the NPN area of the bipolar transistors.

Figure 6:
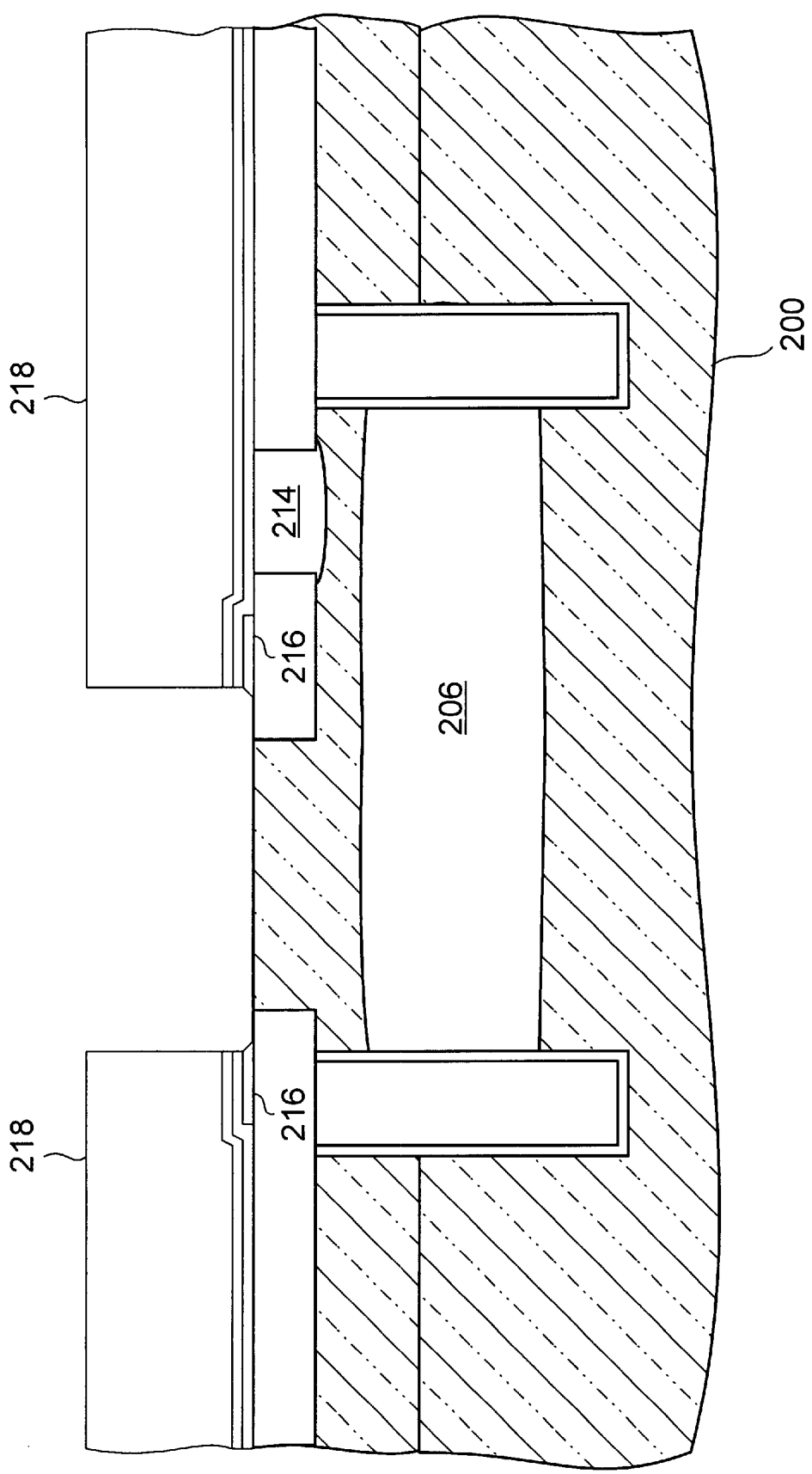

Turning now to FIG. 6, the wafer portion 200 is illustrated after formation of reach through contact implants 214, the depositing and patterning of the NPN protective nitride, the deposition of protective layers, the deposition and patterning of resist layer 218 and the removal of exposed portions of the NPN protective nitride to open the bipolar window and complete nitride pads 216.

It should be noted that in BiCMOS applications, various CMOS process steps would be distributed throughout the described process. For example, some CMOS processing would occur after the formation of the nitride protective layer.

Returning to FIG. 1, the next step 112 is to form a pedestal implant. In the preferred embodiment of the present invention, the pedestal implant forms the deeper part of the stepped and buried implant that provides improved collector resistance while minimizing undesirable collector-base capacitance. In particular, the pedestal implant links to the stepped collector dopant (which will be described in greater detail later) that reduces emitter-collector transit time and parasitic resistance with minimal increase in parasitic capacitances. The pedestal implant links the buried collector to the subcollector and provides a low resistance path to the subcollector. The pedestal implant may be omitted if the subcollector is made sufficiently close to the surface to connect directly to the stepped collector dopant.

In the preferred embodiment, the pedestal implant is formed by depositing and patterning an implant blocking layer (such as a suitable resist layer), and then selectively implanting the pedestal implant into the NPN area of the transistor. The pedestal implant may include one or more energies and doses such that it is relatively uniform in concentration. Generally it is desirable for the n-type pedestal implant to be between approximately $10^{17}$ and $10^{18}$ atoms/cm$^3$ extending uniformly from the wafer surface to the subcollector.

Figure 7:
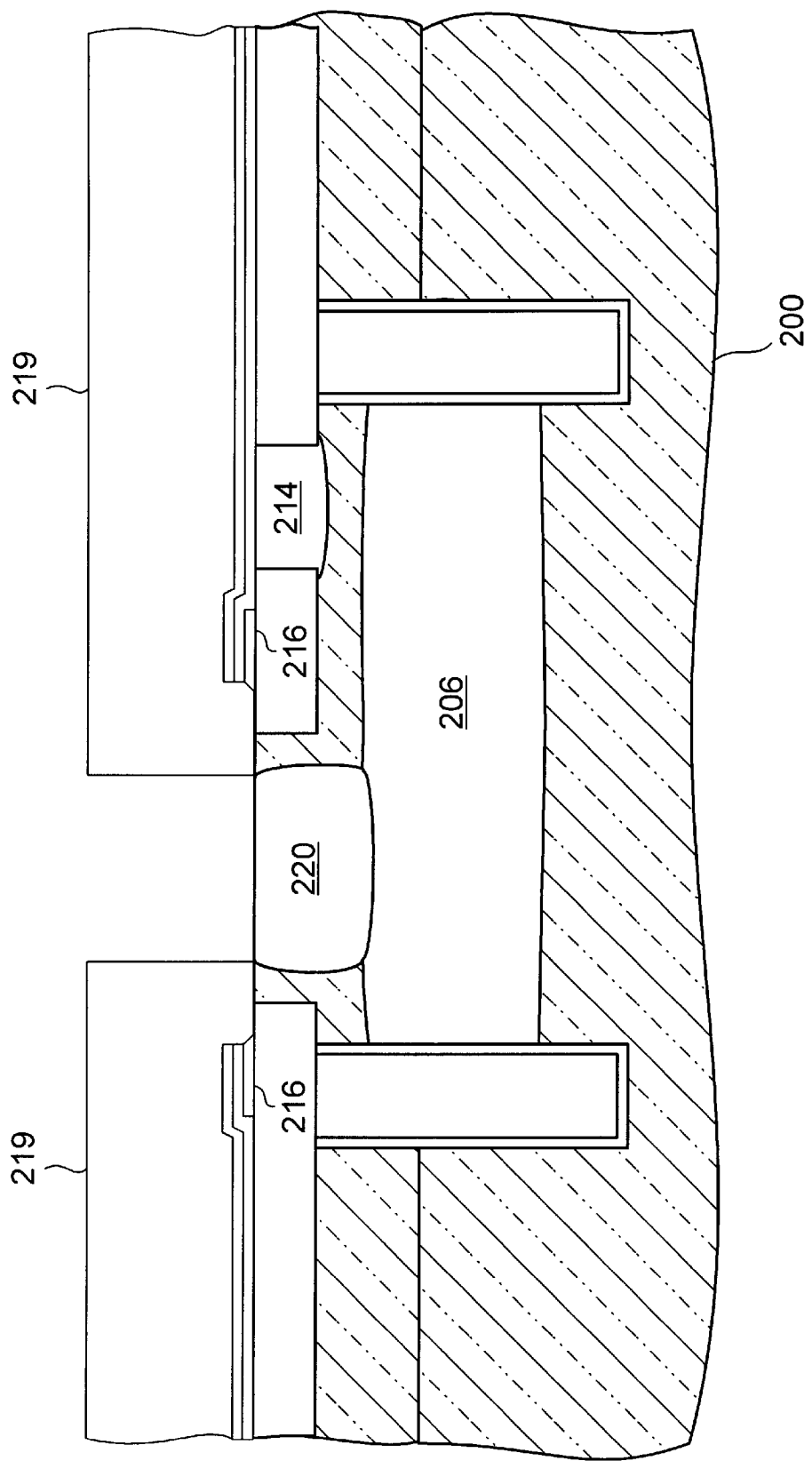

Turning now to FIG. 7, the wafer portion 200 is illustrated after the formation and patterning of an implant blocking layer 219, and the formation of a pedestal implant 220 through the opening in the implant blocking layer 219.

Figure 8:
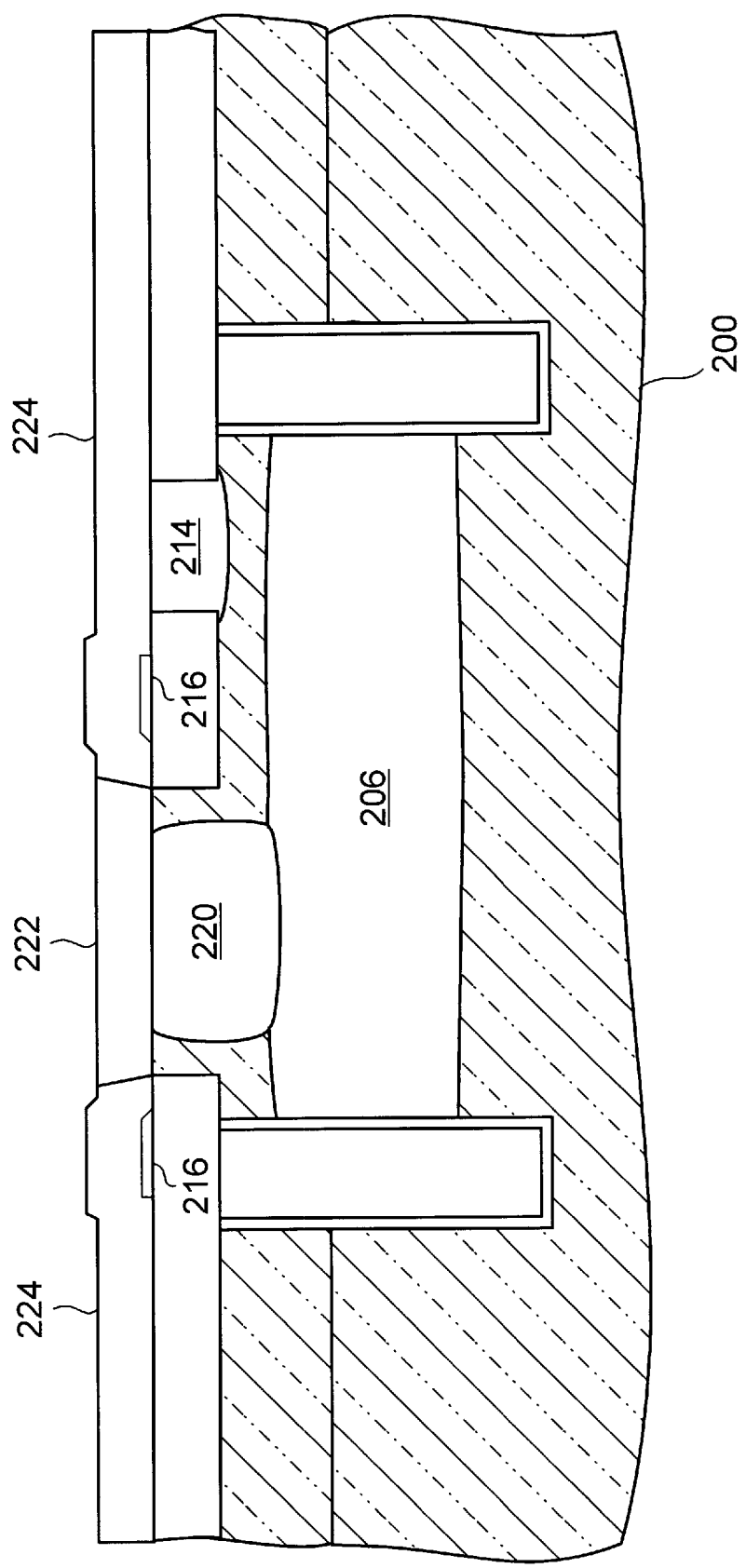

Returning to FIG. 1, the next step 114 is to grow an epitaxial SiGe layer on the wafer substrate. First the implant blocking layer and protective layers are removed, and a low temperature epitaxial (LTE) film growth of Si/SiGe is performed. This forms a single crystal SiGe film layer with the intrinsic base dopant, in the area directly over the exposed NPN region, and a polycrystalline or amorphous film layer in the adjacent portions directly over the shallow trench isolation. These will be used to form the base of the bipolar transistor. In the preferred embodiment, the film is grown to a thickness that is sufficient to separate the base dopants (as deposited or later implanted or diffused) from the pedestal implant, so as to minimize capacitance between these dopant layers. Additionally, the film preferably has a thickness sufficient to fully contain the extrinsic base in the film. With the pedestal dopant 220 at the growth surface, this prevents the extrinsic base from intersecting the collector dopant, this minimizing capacitance. The range of thickness for this film may generally be between 0.1 µm and 0.2 µm. Turning now to FIG. 8, the wafer portion 200 is illustrated after a film growth of Si/SiGe is performed that forms a single crystal SiGe film 222 over the NPN region, and polycrystalline film 224 over the shallow trench isolation regions.

Figure 9:
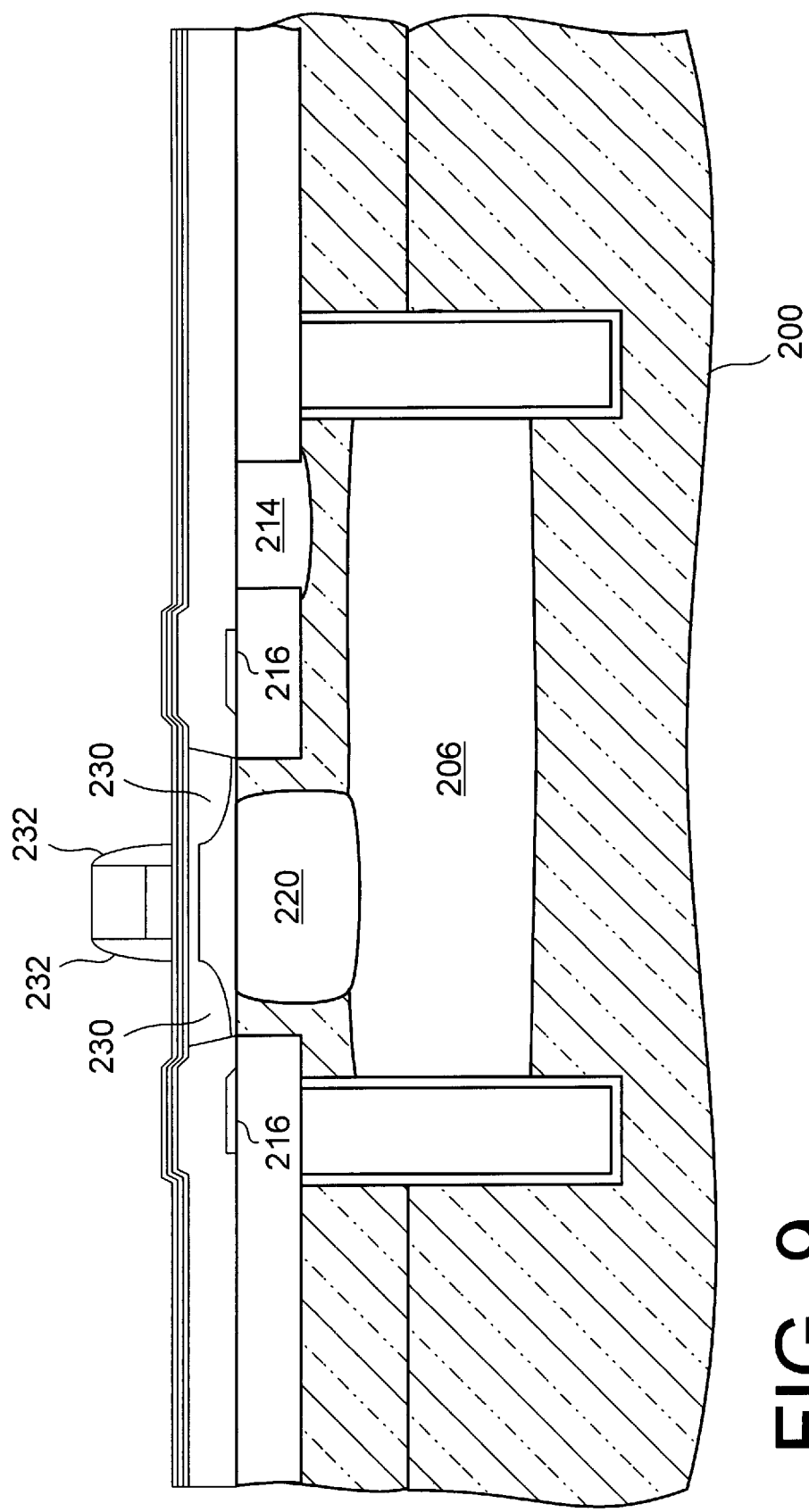

The next step 116 is to form the emitter films and form the extrinsic base of the transistor. First, an oxide layer is then grown followed by a nitride layer and a polysilicon layer. Next, the emitter films are grown or deposited. In the preferred embodiment, the emitter films are relatively thin, between 50–100 nm to allow the later extrinsic base to penetrate. To define the emitter and the extrinsic base, an emitter mask (EN) and resist layer are applied. Oxide and nitride layers are etched to define the emitter region followed by stripping of the EN resist and forming oxide over and alongside emitter. To reduce access resistance to the base of the device, a p-type dopant is implanted a controlled distance from the emitter. Prior to implanting the extrinsic base, a spacer deposit is made and etched to define the spacing between the base and the emitter. The base is then implanted with p+ dopants. The implant concentration is chosen such that the extrinsic base region is much lower resistance than the intrinsic base region of the device. The result is illustrated in FIG. 9, where the wafer portion 200 is illustrated showing the base implanted with p+ dopants 230 using oxide sidewall spacers 232 to define the spacing between the extrinsic base and the emitter.

Figure 10:
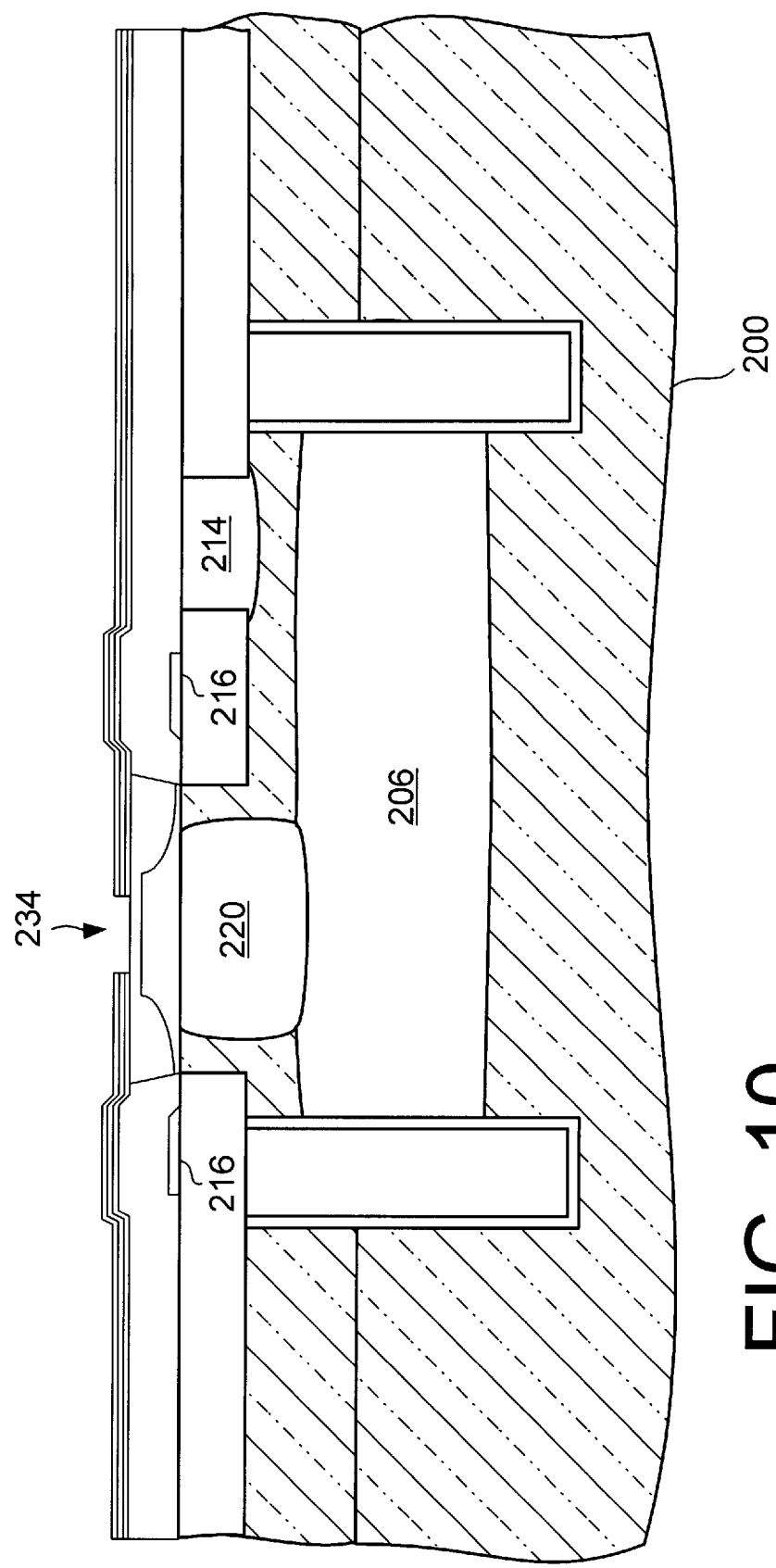

Next, the oxide spacers are removed and there is performed a high pressure oxidation polysilicon conversion to oxide followed by an oxide/nitride etch and removal of the emitter window in the protective oxide/nitride/polysilicon films. The result of this step is illustrated in FIG. 10, where wafer portion 200 is illustrated after an emitter window 234 has been opened in the oxide/nitride/polysilicon layers.

The next step 118 is to form a stepped collector implant. The stepped collector implant combines with the previously formed pedestal implant to result in a stepped collector dopant profile that reduces emitter-collector transit time and parasitic resistance with minimal increase in parasitic capacitances. In particular, the stepped implant reduces the base-collector space-charge region width, reduces collector resistance, and tailors the collector-base breakdown characteristics. The stepped implant is desired to minimize contact area with the extrinsic base of the transistor, and thus reduces the amount of parasitic collector-base capacitance.

To form the stepped collector implant, an optional blocking layer (such as photoresist) is deposited and patterned, such that the emitter opening 234 is exposed. This photoresist, because of possible misalignment and image size variations, is opened over portions of the oxide/nitride/oxide protective layer surrounding the emitter opening. An implant is then made to form the stepped collector dopant profile. The proper combination of implant energy and dose, and prior-deposited protective oxide/nitride/oxide emitter film thickness must be chosen to optimize the device characteristics. Through the emitter opening 234, the implant energy and dose is tailored to obtain the proper transistor transit time and breakdown characteristics. The energy must be sufficient to link up with the prior pedestal implant 220. More than one implant (e.g., shallow and deep) may be required to satisfy these requirements. Energies in the range of 50 to 200 KeV, and doses from $1\times10^{12}$ to $3\times10^{13}$ atoms/cm$^2$ are expected. Resulting doses are in the range of $1\times10^{17}$ to $2\times10^{18}$ atoms/cm$^3$. In the region below the protective oxide/nitride/oxide films, the implant will be at a lesser depth than through the emitter opening because it must pass through the oxide/nitride/oxide protective films. This is the origin of the "stepped" profile referred to in this document. Because this implant is at a lesser depth than under the emitter opening, and because the extrinsic base dopant profile extends to a depth greater than the intrinsic base dopant, the minimum capacitance is obtained when the collector stepped profile is fully buried within the extrinsic base dopant profile wherever possible. Thus the combination of oxide/nitride/oxide film thicknesses, extrinsic base implant conditions, and collector implant conditions must be carefully chosen such that the collector implant is stepped to a sufficiently shallow depth, and the extrinsic base is sufficiently deep and at a higher concentration, that the extrinsic base junction depth is greater than the stepped portion of the collector, and the extrinsic base dopants compensate the collector dopants in this region.

It is also pointed out that the combination of the prior-implanted pedestal 220 or subcollector (in the absence of the pedestal 220) should be sufficiently close to the intrinsic device that the stepped collector implant will intersect with this region at a shallow implant depth so that the stepped collector remain buried in the extrinsic base profile. The prior-implanted pedestal 220 or subcollector should be deep enough (where the depth is defined by the SiGe film growth thickness) to not intersect the extrinsic base dopants, in which case it would dramatically increase the capacitance.

Figure 11:
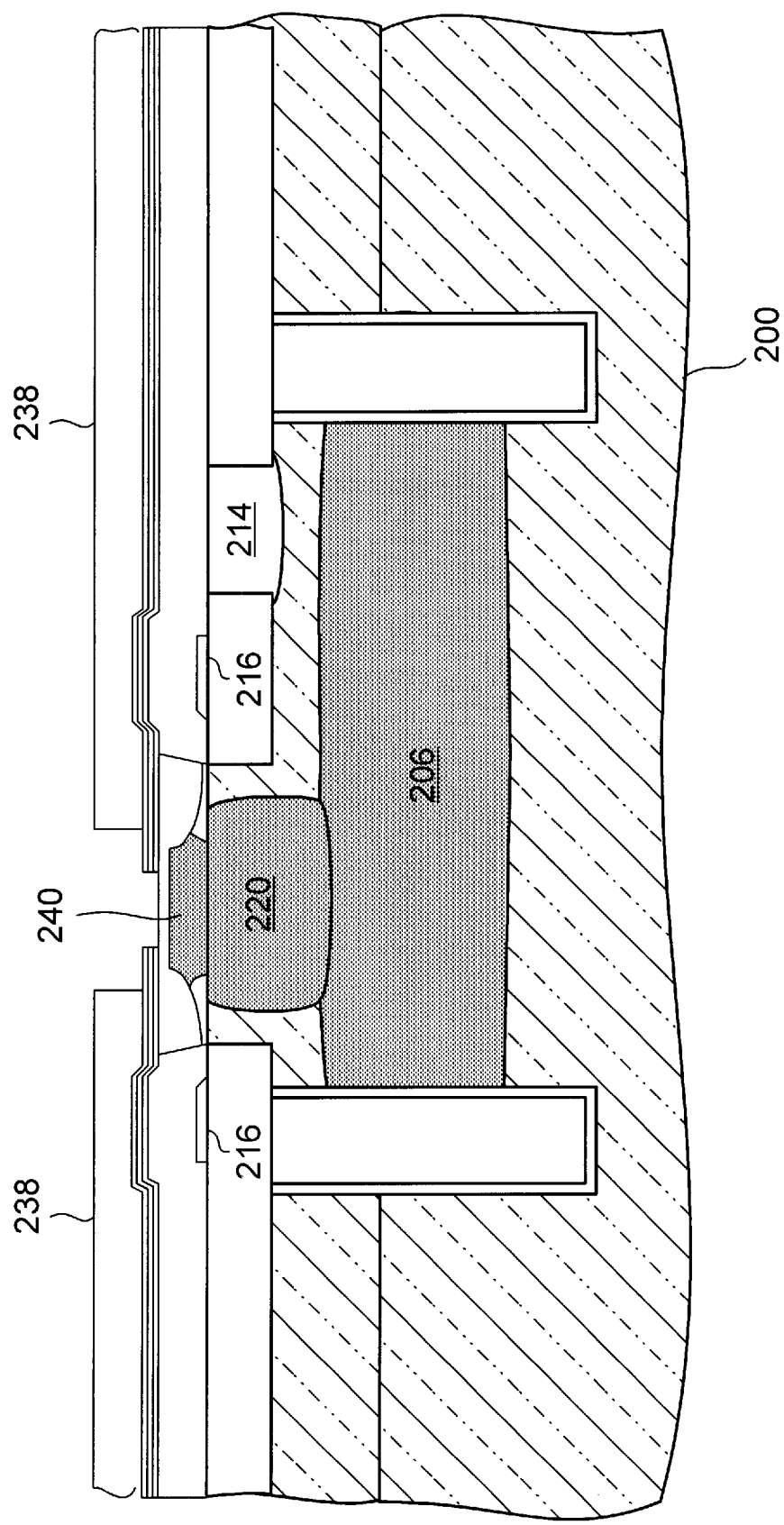

Turning to FIG. 11, the wafer portion 200 is illustrated after the deposition and patterning of a implant blocking layer 238, and the implantation of a stepped collector implant 240 has been made. As illustrated in FIG. 11, the resulting stepped collector implant 240 extends to a depth greater than the extrinsic base under and proximate the intrinsic base, and does not extend below the extrinsic base in areas not under and not proximate the intrinsic base. Stated another way, the stepped collector implant extends through said implant blocking layer to a first distance under said window and to a second distance under said implant blocking layer, said second distance less than said first distance, so that said portion of said collector intersects said extrinsic base only adjacent said window.

The stepped collector implant 240 combines with the previously made pedestal implant 220 and subcollector implant 206 to provide a unique stepped collector dopant profile that reduces emitter-collector transit time and parasitic resistance with minimal increase in parasitic capacitances. In particular, the stepped implant reduces the base-collector space-charge region width and tailors the collector-base breakdown characteristics. The stepped implant is desired to minimize contact area with the extrinsic base of the transistor, and thus reduces the amount of parasitic collector-base capacitance.

Figure 12:
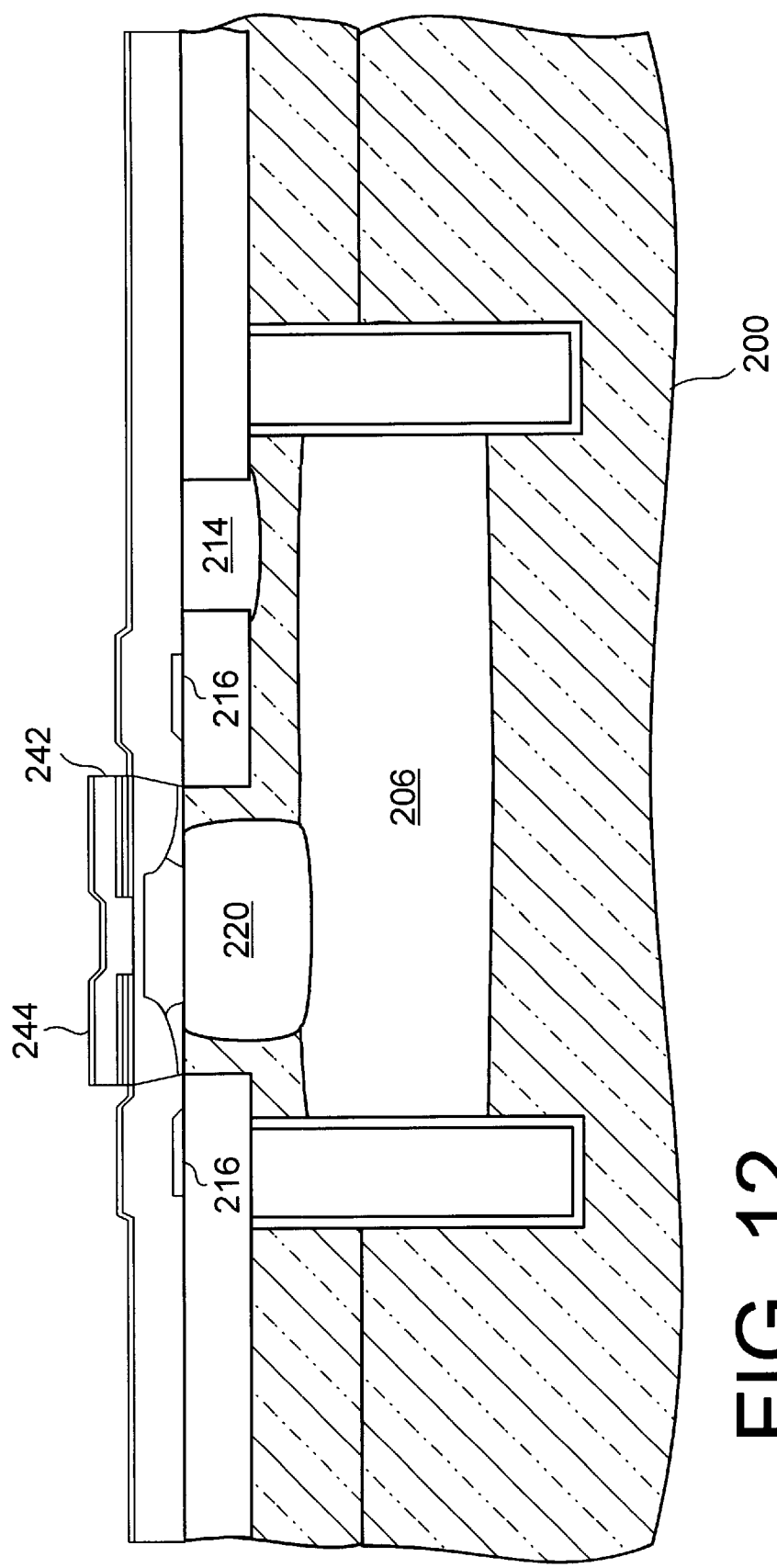

Returning to method 100, the next step 120 is to form and pattern the emitter. This is preferably done by forming a polysilicon film in the emitter area followed by n+ doping of the polysilicon film to form the emitter, and the formation of a polysilicon cap of the film. A resist is then deposited and patterned to define the emitter. Turning FIG. 12, the wafer portion 200 is illustrated after the deposition of polysilicon film 242, implantation, the deposition of polysilicon cap 244, and the patterning of film 242 and cap 244 to form the emitter.

Figure 13:
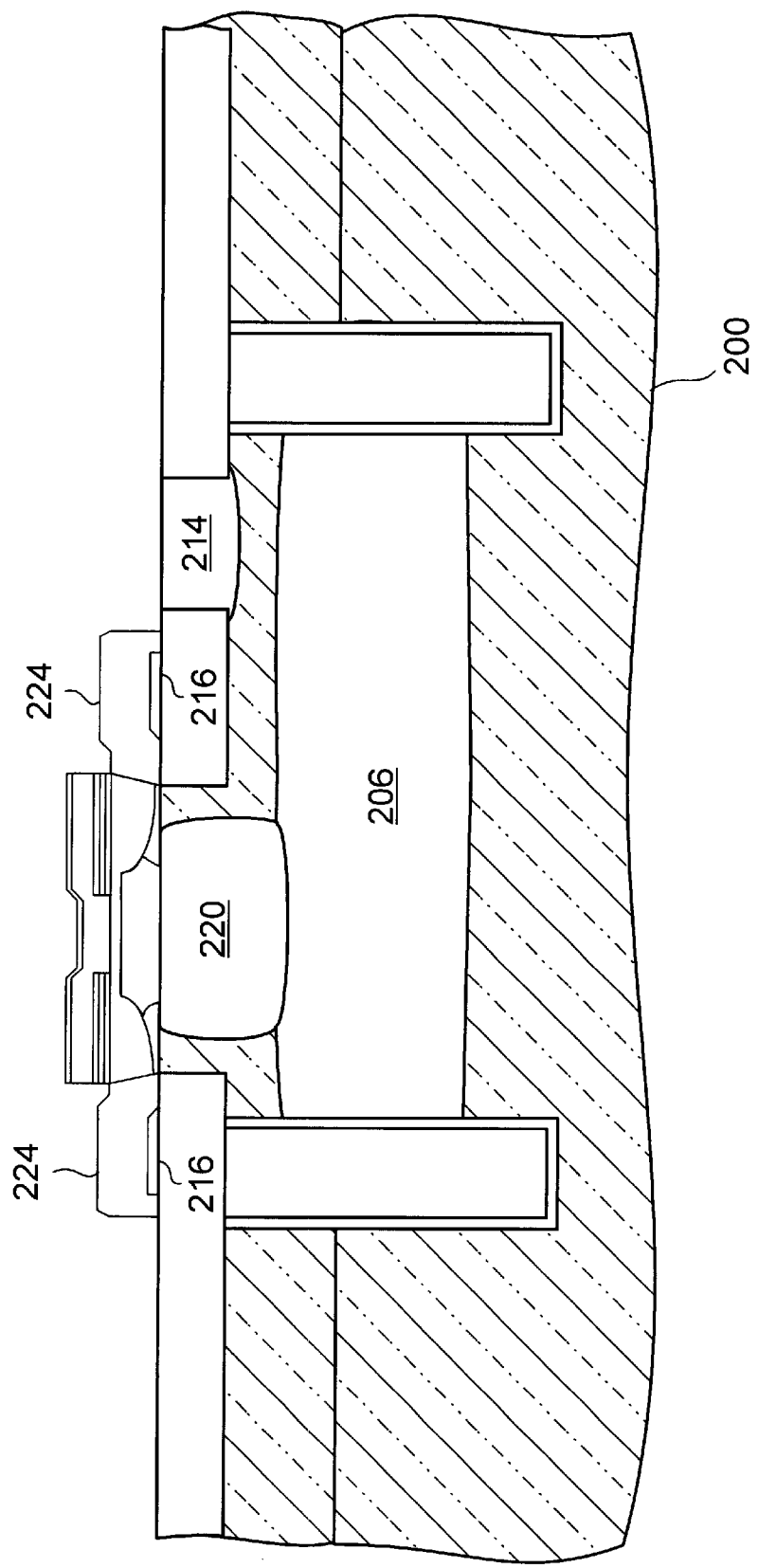
Figure 14:
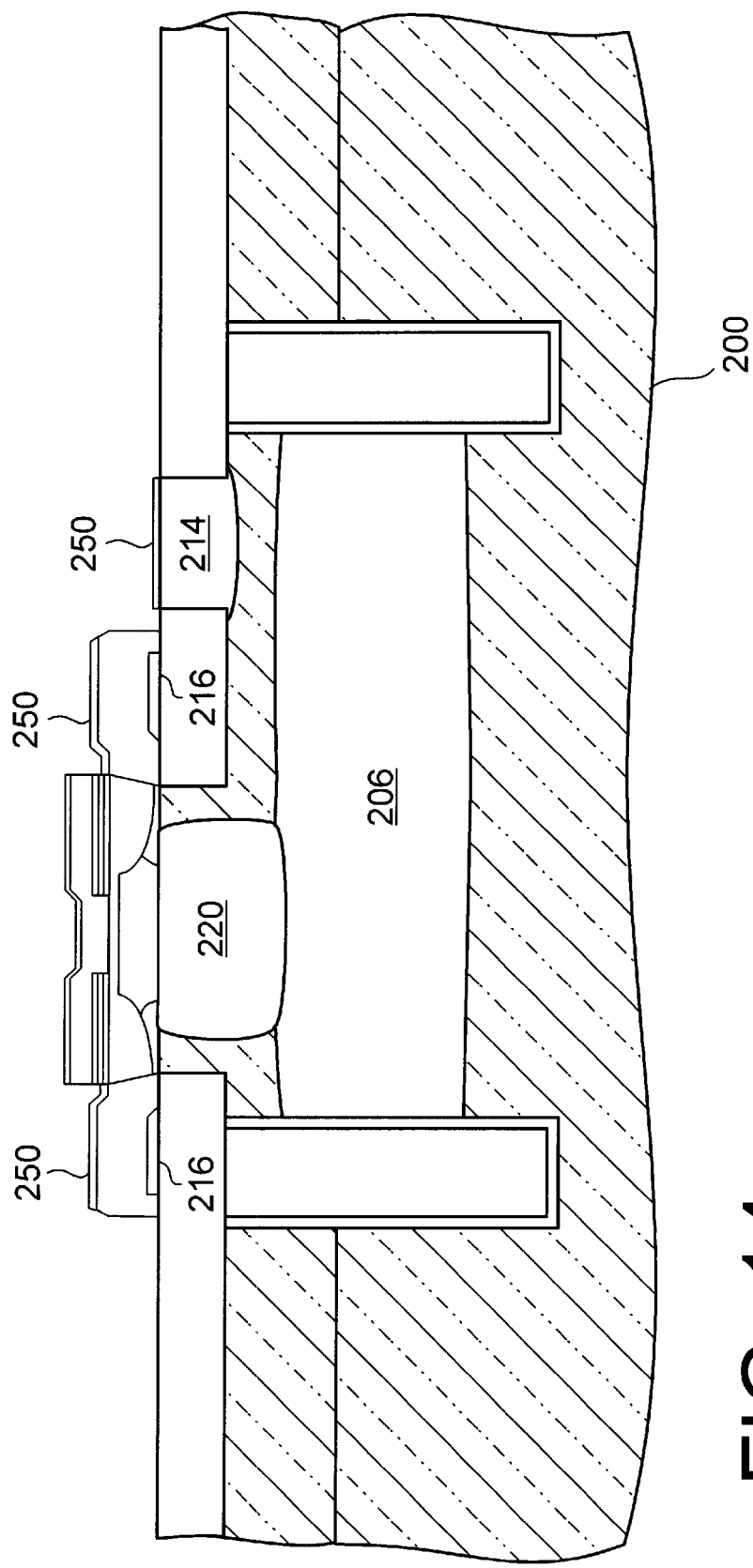

The next step 122 is to pattern and define the base of the transistor. This is preferably done by applying and patterning resist and using the patterned resist to define the transistor base. The SiGe base layer is then etched to define the transistor base. Turning to FIG. 13, the wafer portion 200 is illustrated after the SiGe base layer 224 has been patterned to define the base. Next, there is deposited titanium silicide with the self aligned silicide forming on the exposed p+ polysilicon regions. Subsequently, the silicide cap TiSix formation is performed. Turning to FIG. 14, the wafer portion 200 is illustrated after the formation of TiSix silicide cap 250.

With the devices completed to this point, standard back end of line processing can be used to form the connections between devices. Thus, the preferred embodiment of the present invention provides a stepped collector dopant profile that reduces emitter-collector transit time and parasitic resistance with minimal increase in parasitic capacitances. In particular, the stepped implant reduces the base-collector space-charge region width and tailors the collector-base breakdown characteristics. The stepped implant is desired to minimize contact area with the extrinsic base of the transistor, and thus reduces the amount of parasitic collector-base capacitance.

While the invention has been particularly shown and described with reference to heterojunction bipolar transistors, those skilled in the art will recognized that the preferred methods can be used to form other types of transistors, and that various changes in form and details may be made therein without departing from the spirit and scope of the invention. For example, it can be used with other BiCMOS passive and active elements, such as other types of transistors, varactors, and/or a p-i-n diode.

What is claimed is:

1. A method for forming a transistor, the method comprising the steps of:
   a) providing a semiconductor substrate;
   b) providing a base, the base comprising an intrinsic base and an extrinsic base;
   c) providing an implant blocking layer on the substrate, the implant blocking layer having a thickness;
   d) opening an emitter window in said implant blocking layer; and
   e) implanting a dose of dopant for a stepped collector, said implant having an implant energy, the energy selected to provide that said implant extends through said emitter window in said implant blocking layer to a first distance under said emitter window and extends through said implant blocking layer to a second distance under said implant blocking layer, said second distance less than said first distance, such that a resulting stepped collector implant intersects said extrinsic base only adjacent said emitter window.

2. The method of claim 1 wherein the base comprises an epitaxially grown layer.

3. The method of claim 2 wherein the base comprises silicon germanium.

4. The method of claim 1 further comprising the steps of implanting a subcollector into the substrate and implanting a pedestal into the substrate, wherein the pedestal implant couples the stepped collector implant to the subcollector.

5. The method of claim 1 wherein the step of providing a base comprises providing an epitaxially grown layer having thickness sufficient to allow the entire extrinsic base to be formed within the epitaxially grown layer.

6. The method of claim 1 wherein the implant blocking layer comprises photoresist, and wherein the step of opening an emitter window in the implant blocking layer comprises patterning the photoresist.

7. The method of claim 1 wherein the first distance comprises a distance greater than the depth of the extrinsic base and wherein the second distance comprises a distance less than the depth of the extrinsic base.

8. The method of claim 1 wherein the step of implanting a dose of dopant for a stepped collector implant comprises implanting at an energy between 50 keV and 200 keV.

9. A method for forming bipolar transistor on a semiconductor substrate, the method comprising the steps of:
   a) providing a semiconductor substrate;
   b) forming an epitaxial layer on the semiconductor substrate;
   c) forming a base in the epitaxial layer, the base comprising an intrinsic base and an extrinsic base;
   d) providing an implant blocking layer on the substrate, the implant blocking layer having a thickness;
   e) opening an emitter window in said implant blocking layer;
   f) implanting a dose of dopant for a stepped collector, said implant having an implant energy, the energy selected to provide that said implant extends to below the extrinsic base under and proximate the emitter window and does not extend below the extrinsic base in areas not under and not proximate the emitter window.

10. The method of claim 9 wherein the extrinsic base has a depth such that it is formed completely with the epitaxial layer.

11. The method of claim 9 wherein the epitaxial layer comprises silicon germanium.

12. The method of claim 9 further comprising the steps of implanting a subcollector into the substrate and implanting a pedestal into the substrate, wherein the pedestal implant couples a stepped collector implant to the subcollector.

13. The method of claim 9 wherein the step of implanting a dose of dopant for a stepped collector comprises implanting at an energy between 50 keV and 200.

14. The method of claim 9 wherein the implant blocking layer comprises photoresist, and wherein the step of opening an emitter window in the implant blocking layer comprises patterning the photoresist.

* * * * *